(12) United States Patent
Hsu et al.

(10) Patent No.: US 7,706,148 B2
(45) Date of Patent: Apr. 27, 2010

(54) STACK STRUCTURE OF CIRCUIT BOARDS EMBEDDED WITH SEMICONDUCTOR CHIPS

(75) Inventors: Shih Ping Hsu, Hsin-chu (TW); Chung Cheng Lien, Hsin-chu (TW); Chia Wei Chang, Hsin-chu (TW)

(73) Assignee: Phoenix Precision Technology Corporation, Hsin-Chu (TW)

( * ) Notice: Subject to any disclaimer, the term of this patent is extended or adjusted under 35 U.S.C. 154(b) by 666 days.

(21) Appl. No.: 11/588,914

(22) Filed: Oct. 27, 2006

(65) Prior Publication Data

US 2009/0091903 A1 Apr. 9, 2009

(30) Foreign Application Priority Data

May 24, 2006 (TW) .............................. 95118404 A

(51) Int. Cl.
*H01R 12/16* (2006.01)
(52) U.S. Cl. .................. 361/790; 361/770; 361/774; 361/803
(58) Field of Classification Search ......... 361/770–774, 361/790, 803; 257/685–686
See application file for complete search history.

(56) References Cited

U.S. PATENT DOCUMENTS

| | | | | |
|---|---|---|---|---|
| 5,323,060 A | | 6/1994 | Fogal et al. | |
| 5,576,519 A | * | 11/1996 | Swamy | 174/265 |
| 6,097,609 A | * | 8/2000 | Kabadi | 361/760 |
| 6,784,530 B2 | * | 8/2004 | Sugaya et al. | 257/686 |
| 7,321,164 B2 | * | 1/2008 | Hsu | 257/686 |
| 7,514,636 B2 | * | 4/2009 | Sasaki | 174/252 |

\* cited by examiner

*Primary Examiner*—Tuan T Dinh
(74) *Attorney, Agent, or Firm*—Sawyer Law Group, P.C.

(57) ABSTRACT

A stack structure of circuit boards embedded with semiconductor chips is proposed. At least two circuit boards are provided. Each of the circuit boards includes circuit layers formed on surfaces thereof and at least one opening embedded with a semiconductor chip, wherein, the circuit layers have a plurality of conductive structures and electrically conductive pads, and the semiconductor chip has a plurality of electrode pads, and the conductive structures of the circuit layers are electrically conductive to the electrode pads of the semiconductor chip. At least one adhesive layer is formed between the two circuit boards and disposed with a conductive material corresponding in position to the electrically conductive pads of the circuit boards. Thus, a conductive path can be formed by the conductive material between the electrically conductive pads of the circuit boards, thereby establishing electrical connection between the two circuit boards.

11 Claims, 4 Drawing Sheets

STACK STRUCTURE OF CIRCUIT BOARDS EMBEDDED WITH SEMICONDUCTOR CHIPS

BACKGROUND OF THE INVENTION

1. Field of the Invention

The present invention relates generally to a stack structure of circuit boards embedded with semiconductor chips, and more particularly to a multi-layer circuit board structure which is formed by stacking a plurality of circuit boards having been embedded with semiconductor chips.

2. Description of Related Art

In order to meet increasing demands for lighter and smaller electronic products, semiconductor chips having different functionality are needed to be embedded in a circuit board in high density. Generally, two or more semiconductor chips are stack mounted to a chip carrier such as a substrate or a lead frame and electrically conductive to the chip carrier by solder wires.

FIG. 1 shows a multi-chip semiconductor package 1 of U.S. Pat. No. 5,323,060. A first semiconductor chip 12a is mounted on a circuit board 11 and electrically conductive to the circuit board 11 by first solder wires 13a. A second semiconductor chip 12b is stack mounted on the first semiconductor chip 12a through an adhesive layer 14. The adhesive layer 14 can be made of epoxy or tape. Thereafter, the second semiconductor chip 12b is electrically conductive to the circuit board 11 by second solder wires 13b. However, the wire bonding process of the first semiconductor chip 12a should be finished before stacking the second semiconductor chip 12b, that is, the die bonding process and wire bonding process should be separately performed for each stacked semiconductor chip, which accordingly complicates the fabrication process of the semiconductor package. Further, to efficiently prevent the second semiconductor chip 12b from contacting the first solder wires 13a, the thickness of the adhesive layer 14 should be bigger than the height of the wire arc of the first solder wires 13a. As a result, the thickness of the multi-chip semiconductor package 1 is increased, thereby limiting the fabrication of much lighter and smaller electronic products. Meanwhile, because it is difficult to evenly control the thickness of the adhesive layer 14, the second semiconductor chip 12b or the second solder wires 13b are easy to be contacted with the first solder wires 13a and accordingly the problems such as short circuits may be generated.

Also, with the integration trend of electronic products, to improve functionality of electronic products and decrease height of the electronic products, semiconductor chips are generally embedded in carrier boards. The embedded semiconductor chips can be active components or passive components. As shown in FIG. 2, a carrier board 20 having at least one opening 200 is provided, and a semiconductor chip 21 is mounted in the opening 200. The semiconductor chip 21 has an active surface 21a having a plurality of electrode pads 212. A dielectric layer 22 is formed on the carrier board 20 and the active surface 21a of the semiconductor chip 21. A circuit layer 23 is formed on the dielectric layer 22. The circuit layer 23 has a plurality of conductive structures 231 for electrically conductive to the electrode pads 212 of the semiconductor chip 21. Using a circuit build-up process, multi-layer circuit layers and dielectric layers can be formed so as to form a multi-layer circuit board.

To improve electrical performance of the carrier board 20, the number of the semiconductor chips 21 accordingly should be increased. Therefore, a plurality of openings 200 have to be formed in the carrier board 20. However, the limited size of the carrier board 20 limits the number of the openings and thus limits the improvement of the electrical performance of the carrier board 20.

Therefore, there is a need to provide a structure of circuit boards embedded with semiconductor chips that can overcome the above drawbacks.

SUMMARY OF THE INVENTION

According to the above drawbacks, an objective of the present invention is to provide a stack structure of circuit boards embedded with semiconductor chips, which is formed by a laminating process so as to simplify the fabrication process and reduce cost.

Another objective of the present invention is to provide a stack structure of circuit boards embedded with semiconductor chips with improved electrical demand and functionality.

In order to attain the above and other objectives, the present invention discloses a stack structure of circuit boards embedded with semiconductor chips, comprising: at least two circuit boards each having circuit layers formed on surfaces thereof and at least one opening with a semiconductor chip embedded therein, the semiconductor chip having a plurality of electrode pads, the circuit layers having a plurality of conductive structures and a plurality of electrically conductive pads wherein the conductive structures being electrically conductive to the electrode pads of the semiconductor chip; and at least one adhesive layer formed between the at least two circuit boards and disposed with a conductive material corresponding in position to the electrically conductive pads so as to form a conductive path by the conductive material between the electrically conductive pads of the circuit boards, thereby establishing electrical connection between the circuit boards.

The circuit boards can be printed circuit boards or IC package substrates. A plurality of openings corresponding in position to the electrically conductive pads of the two circuit boards are first formed in the adhesive layer, and then filled with a conductive material such as a colloid material comprising metal material or a solder material, wherein the metal material is one selected from the group consisting of Cu, Sn, Ag, Ni, Au, Ni/Au, and Ni/Pd/Au. By interposing the adhesive layer between the circuit boards and performing a laminating process, a conductive path is formed between the electrically conductive pads of the two circuit boards through the conductive material and accordingly electrical connection between the two circuit boards is established.

Insulating protection layers are formed on surfaces of the circuit boards where the adhesive layer is not formed thereon, and a plurality of openings are formed in the insulating protection layers for exposing the electrically conductive pads of the circuit layers.

Alternatively, circuit build-up structures are formed on surfaces of the circuit boards where the adhesive layer is not formed, a plurality of conductive structures electrically conductive to the circuit layers are formed in the circuit build-up structures, and a plurality of electrically conductive pads are formed on surfaces of the circuit build-up structures. Insulating protection layers are further formed on the circuit build-up structures, and a plurality of openings are formed in the insulating protection layers so as to expose the electrically conductive pads of the circuit build-up structures.

In addition, conductive bumps can be formed on surfaces of the electrically conductive pads of the circuit boards. The conductive bumps can be made of one selected from the group consisting of Cu, Sn, Ag, Ni, Au, Ni/Au, and Ni/Pd/Au.

Therefore, by separately forming a plurality of circuit boards with embedded semiconductor chips first, interposing the adhesive layers there between and then performing a laminating process, a stack structure with circuit boards embedded with semiconductor chips is obtained, which not only shortens the fabrication time, but also facilitates the mass production. In addition, the electrical demand and functionality of the whole structure is improved, the fabrication process is simplified and the cost is reduced.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

First Embodiment

Figure 1:
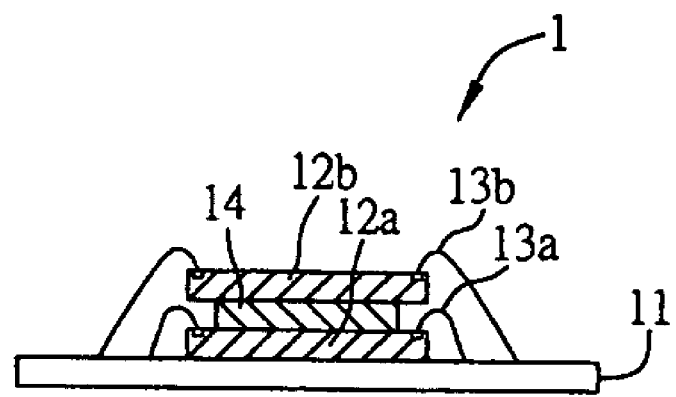
FIG. 1 is a sectional diagram of a chip-stack type semiconductor package according to U.S. Pat. No. 5,323,060.
Figure 2:
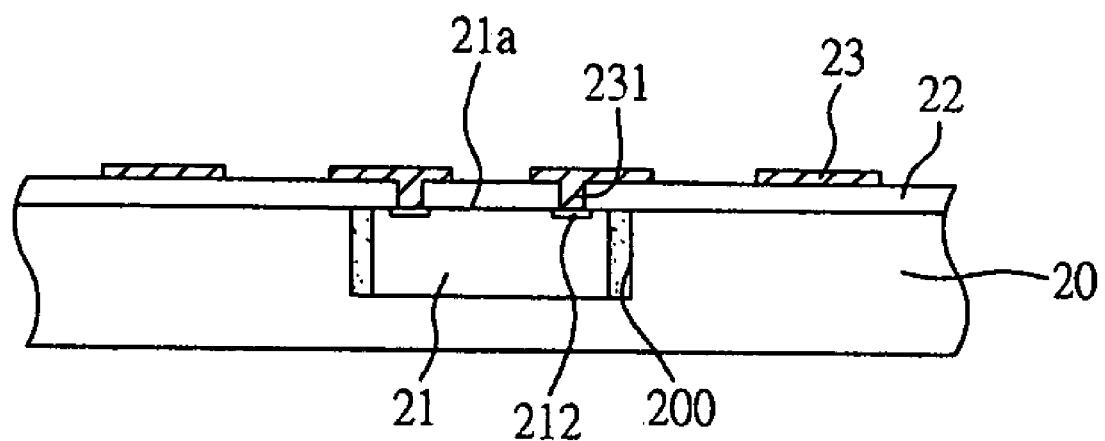
FIG. 2 is a schematic diagram of a conventional circuit board structure embedded with a semiconductor chip.
Figure 3A:
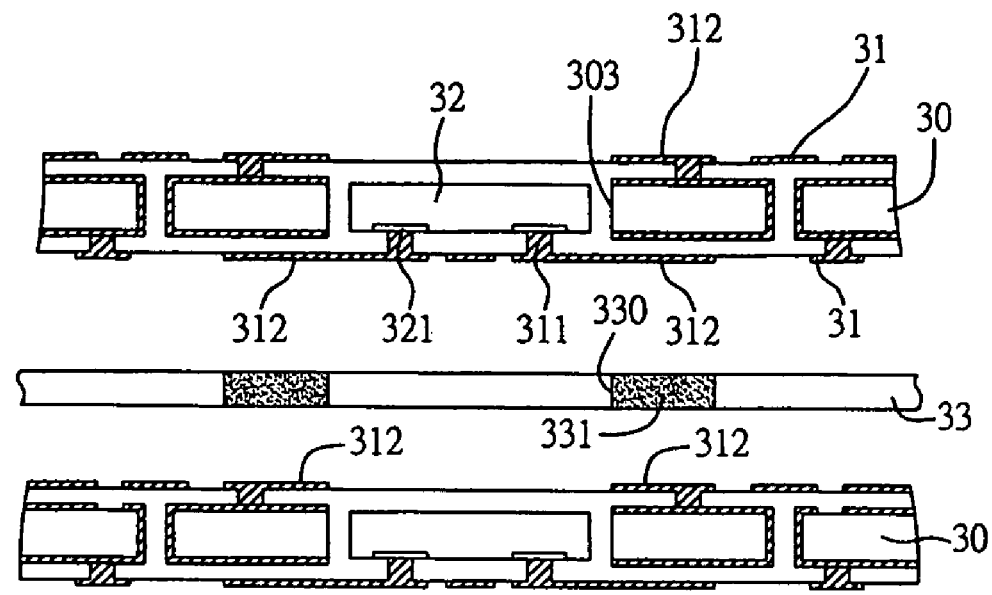
FIGS. 3A and 3B are exploded and assembly diagrams of a stack structure of circuit boards embedded with semiconductor chips according to a first embodiment of the present invention.
Figure 3B:
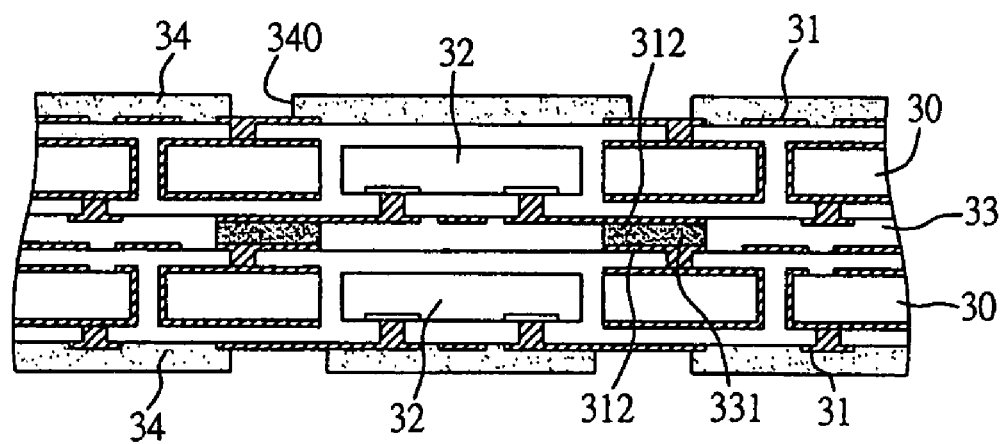

FIGS. 3A and 3B show a stack structure of circuit boards embedded with semiconductor chips according to a first embodiment of the present invention. As shown in FIGS. 3A and 3B, at least two circuit boards 30 are provided, each of which can be such as a printed circuit board or an IC package substrate. Each of the circuit boards 30 has circuit layers 31 formed on surfaces thereof and at least one opening 303 penetrating the circuit board 30. Semiconductor chips 32 are respectively embedded in the openings 303 of the circuit boards 30. Each of the semiconductor chips 32 can be an active component such as a CPU, a DRAM, a SRAM and a SDRAM, or a passive component such as a capacitor, a resistor and an inductor. The semiconductor chips 32 have a plurality of electrode pads 321, and the circuit layers 31 have a plurality of conductive structures 311 electrically conductive to the electrode pads 321 of the semiconductor chips 32. The circuit layers 31 also have a plurality of electrically conductive pads 312. At least one adhesive layer 33 is formed between the two circuit boards 30 and disposed with a conductive material 331 corresponding in position to the electrically conductive pads 312 of the at least two circuit boards 30 so as to form a conductive path by the conductive material between the electrically conductive pads 312 of the two circuit boards 30, thereby establishing electrical connection between the two circuit boards 30.

To obtain the adhesive layer 33 disposed with the conductive material 331 at corresponding positions, a plurality of openings 330 corresponding in position to the electrically conductive pads 312 of the two circuit boards 30 are first formed in the adhesive layer 33. Then, the openings 330 are filled with the conductive material 331 such as a colloid material comprising metal material or a solder material. Therein, the metal material is one selected from the group consisting of Cu, Sn, Ag, Ni, Au, Ni/Au, and Ni/Pd/Au.

Referring to FIG. 3B, by performing such as a laminating process, the two circuit boards 30 are closely combined together through the adhesive layer 33 and the electrically conductive pads 312 of the circuit boards 30 are electrically conductive to each other through the conductive material 331 in the adhesive layer 33. As a result, electrical connection is established between the two circuit boards 30.

Furthermore, insulating protection layers 34 are formed on surfaces of the circuit board 30 where the adhesive layer 33 is not formed thereon. A plurality of openings 340 are formed in the insulating protection layers 34 so as to expose the electrically conductive pads 312 of the circuit layers 31. Other conductive elements (not shown) can further be formed on the electrically conductive pads 312 for electrical connection with external electronic devices.

Second Embodiment

Figure 4:
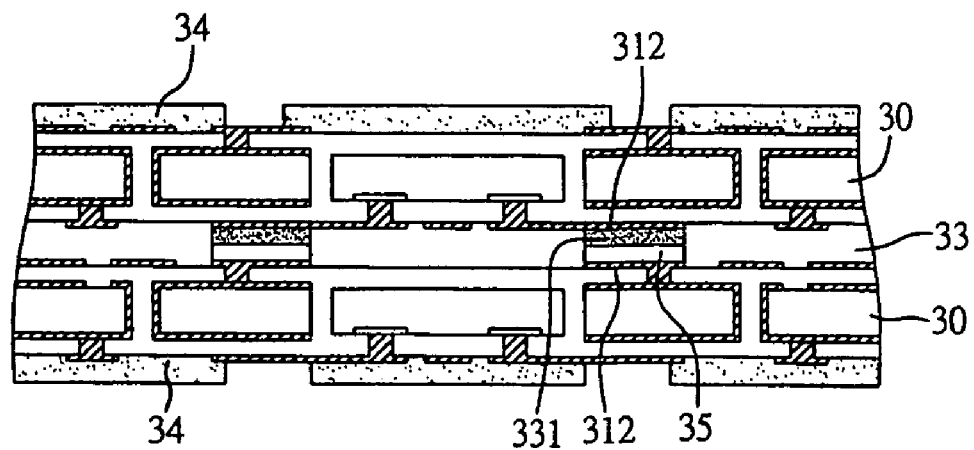
FIG. 4 is a sectional diagram of a stack structure of circuit boards embedded with semiconductor chips according to a second embodiment of the present invention.

FIG. 4 shows a stack structure of circuit boards embedded with semiconductor chips according to a second embodiment of the present invention. Different from the first embodiment, a plurality of conductive bumps 35 are formed on surfaces of the electrically conductive pads 312 of one of the circuit boards 30. The conductive bumps 35 can be made of Cu, Sn, Ag, Ni, Au, Ni/Au, or Ni/Pd/Au. By laminating against the conductive material 331 of the adhesive layer 33 with the conductive bumps 35, the adhesive layer 33 can be in contact with the surfaces of the electrically conductive pads 312 of the other circuit board 30.

Third Embodiment

Figure 5:
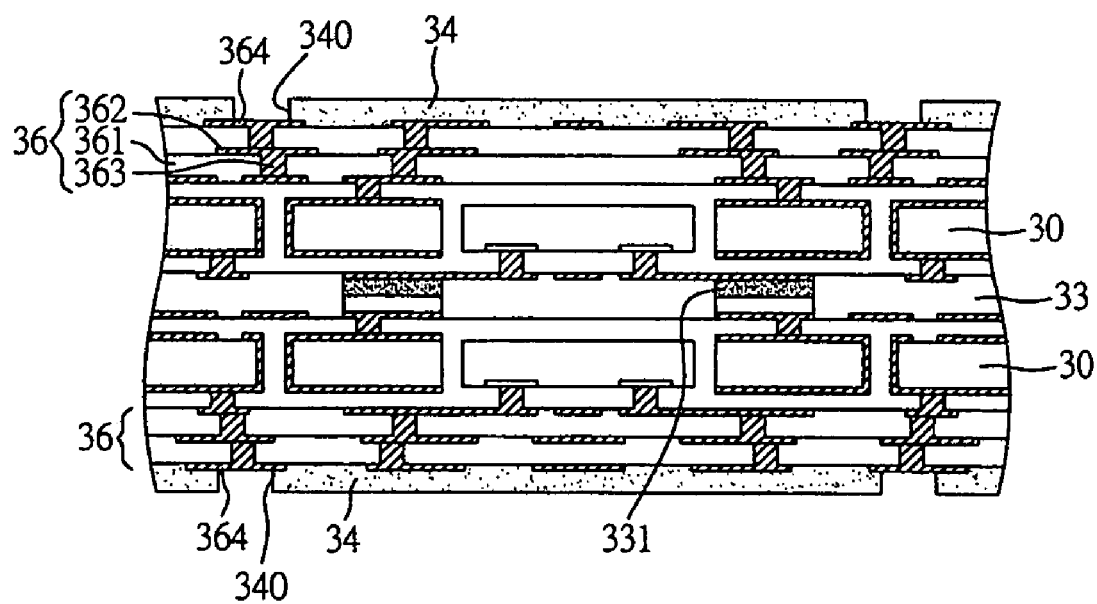
FIG. 5 is a sectional diagram of a stack structure of circuit boards embedded with semiconductor chips according to a third embodiment of the present invention.

FIG. 5 shows a stack structure of circuit boards embedded with semiconductor chips according to a third embodiment of the present invention. Different from the above-mentioned embodiments, circuit build-up structures 36 are formed on surfaces of the circuit boards 30 where the adhesive layer 33 is not formed. Each circuit build-up structure 36 comprises a dielectric layer 361, a circuit layer 362 formed on the dielectric layer 361, and conductive structures 363 formed in the dielectric layer 361. The conductive structures 363 are electrically conductive to the circuit layers 31 of the circuit boards 30. A plurality of electrically conductive pads 364 are formed on surfaces of the circuit build-up structures 36, and insulating protection layers 34 are formed on surfaces of the circuit build-up structures 36. The insulating protection layers 34 have a plurality of openings 340 for exposing the electrically conductive pads 364 of the circuit build-up structures 36.

Fourth Embodiment

Figure 6:
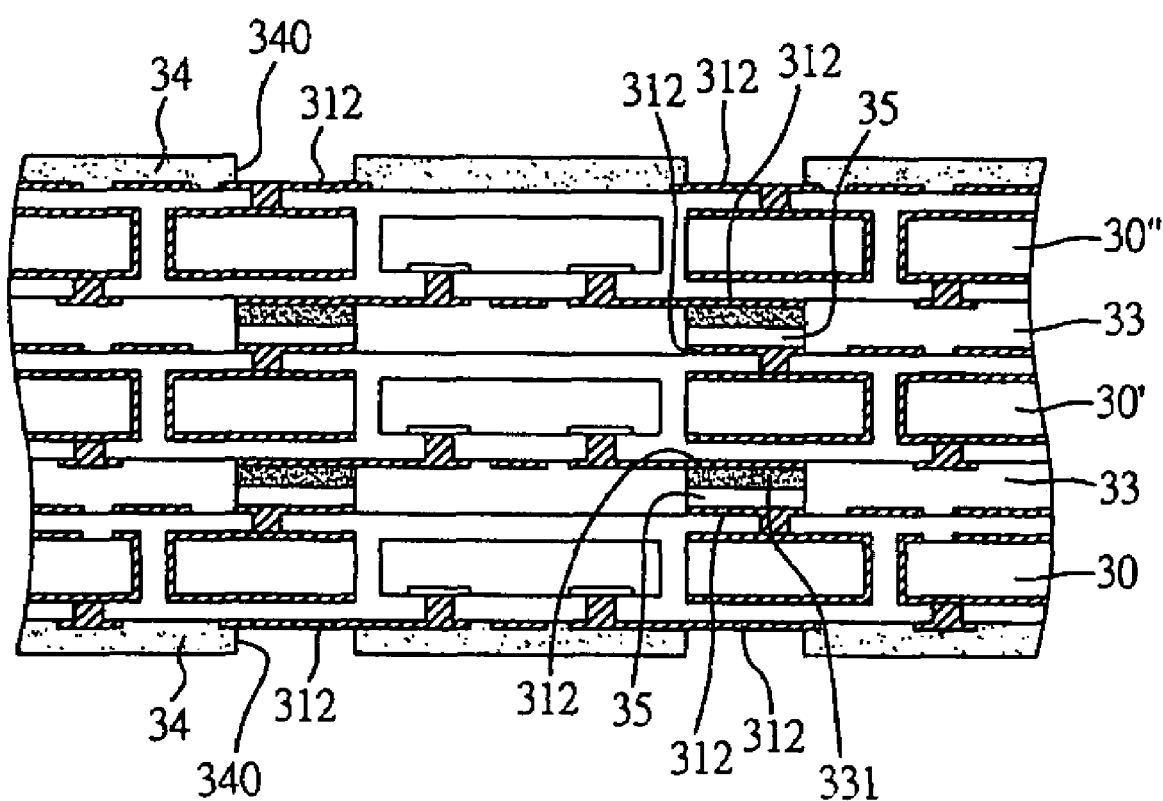
FIG. 6 is a sectional diagram of a stack structure of circuit boards embedded with semiconductor chips according to a fourth embodiment of the present invention.

FIG. 6 shows a stack structure of circuit boards embedded with semiconductor chips according to a fourth embodiment of the present invention. In the present embodiment, a multilayer circuit board stack structure is formed by stacking a plurality of circuit boards with interposition there between of a plurality of adhesive layers comprising conductive material. As shown in FIG. 6, a plurality of conductive bumps 35 are formed on electrically conductive pads 312 on a surface of a first circuit board 30. A second circuit board 30' is stacked on the first circuit board 30 with its electrically conductive pads 312 stacked on the conductive bumps 35 on the electrically conductive pads 312 of the first circuit board 30, and an adhesive layer 33 comprising a conductive material 331 is interposed between the first and second circuit boards 30, 30'. A third circuit board 30" is further stacked on the second circuit board 30' through another adhesive layer 33 comprising a conductive material 331. In this way, a multi-layer circuit board stack structure can be obtained.

In addition, insulating protection layers 34 can further be formed on the outermost circuit layers 31 of the first and third circuit boards 30, 30", and a plurality of openings 340 are formed in the insulating protection layers 34 so as to expose the electrically conductive pads 312 of the circuit layers 31. Other conductive elements (not shown) can be formed on surfaces of the electrically conductive pads 312 for electrical connection with external electronic devices.

According to the present invention, at least two circuit boards are provided with electrically conductive pads or conductive bumps formed on surfaces thereof and semiconductor chips embedded therein. An adhesive layer comprising a conductive material is interposed between the at least two circuit boards, with the conductive material disposed at positions corresponding to the electrically conductive pads of the circuit boards. By performing a laminating process, the conductive material of the adhesive layer comes into contact with the electrically conductive pads of the at least two circuit boards so as to form a conductive path between the electrically conductive pads of the circuit boards, thus allowing a plurality of stacked circuit boards and the semiconductor chips embedded therein to be electrically conductive to each other. Therefore, not only the fabrication process is simplified, the electrical demand and functionality of the whole structure is also strengthened. In addition, a plurality of circuit boards can be fabricated separately and then integrated through a laminating process so as to form a circuit board stack structure, thereby shortening the fabrication time of multi-layer circuit boards and facilitating the mass production.

The above descriptions of the specific embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A stack structure of circuit boards embedded with semiconductor chips, comprising:
    at least two circuit boards each having first circuit layers formed on surfaces thereof and at least one opening with a semiconductor chip embedded therein, the semiconductor chip having a plurality of electrode pads, the first circuit layers having a plurality of first conductive structures and a plurality of first electrically conductive pads, the first conductive structures being electrically conductive to the electrode pads of the semiconductor chip;
    at least one adhesive layer formed between the at least two circuit boards and disposed with a conductive material corresponding in position to the first electrically conductive pads so as to form a conductive path by the conductive material between the first electrically conductive pads of the circuit boards, thereby establishing electrical connection between the circuit boards;
    circuit build-up structures formed on surfaces of the circuit boards where the adhesive layer is not formed, wherein a plurality of second conductive structures electrically conductive to the first circuit layers are formed in the circuit build-up structures, and a plurality of second electrically conductive pads are formed on surfaces of the circuit build-up structures; and
    insulating protection layers formed on the circuit build-up structures, wherein a plurality of openings are formed in the insulating protection layers so as to expose the second electrically conductive pads of the circuit build-up structures.

2. The stack structure of claim 1, wherein conductive bumps are further formed on surfaces of the first electrically conductive pads of the circuit boards.

3. The stack structure of claim 1, wherein the openings of the circuit boards penetrate through the circuit boards.

4. The stack structure of claim 1, wherein each of the circuit boards is one of a printed circuit board and an IC package substrate.

5. The stack structure of claim 1, wherein the semiconductor chip is one of an active component and a passive component.

6. The stack structure of claim 1, wherein insulating protection layers are formed on surfaces of the circuit boards where the adhesive layer is not formed, and a plurality of openings are formed in the insulating protection layers for exposing the first electrically conductive pads of the circuit layers.

7. The stack structure of claim 1, wherein the circuit build-up structures comprise dielectric layers, second circuit layers formed on the dielectric layers, and the second conductive structures formed in the dielectric layers.

8. The stack structure of claim 1, wherein the conductive material is one of a colloid material comprising metal material and a solder material.

9. The stack structure of claim 8, wherein the metal material is one selected from the group consisting of Cu, Sn, Ag, Ni, Au, Ni/Au, and Ni/Pd/Au.

10. The stack structure of claim 2, wherein the conductive bumps are made of one selected from the group consisting of Cu, Sn, Ag, Ni, Au, Ni/Au, and Ni/Pd/Au.

11. The stack structure of claim 1, wherein the adhesive layer has a plurality of openings formed at positions corresponding to the first electrically conductive pads of the at least two circuit boards, and the openings are filled with the conductive material.

* * * * *